United States Patent [19]

Liu et al.

[11] Patent Number: 5,925,909
[45] Date of Patent: Jul. 20, 1999

[54] THREE-DIMENSIONAL COMPLEMENTARY FIELD EFFECT TRANSISTOR PROCESS AND STRUCTURES

[75] Inventors: Yowjuang W. Liu, San Jose; Yu Sun, Saratoga, both of Calif.

[73] Assignee: Advanced Micro Devices, Inc., Sunnyvale, Calif.

[21] Appl. No.: 08/555,556

[22] Filed: Nov. 8, 1995

Related U.S. Application Data

[62] Division of application No. 08/509,911, Aug. 1, 1995, Pat. No. 5,672,524.

[51] Int. Cl.$^6$ .......................... H01L 29/76; H01L 29/94; H01L 31/062; H01L 31/113
[52] U.S. Cl. .......................... 257/331; 257/329; 257/334; 257/369; 257/401
[58] Field of Search ..................... 257/408, 344, 257/329, 330, 331, 332, 334, 369, 401

[56] References Cited

U.S. PATENT DOCUMENTS

| | | | |
|---|---|---|---|
| 3,500,142 | 3/1970 | Kahng | 317/235 |
| 4,203,158 | 5/1980 | Frohman-Bentchkowsky et al. | 365/185 |
| 4,267,632 | 5/1981 | Shappir | 29/571 |
| 4,597,827 | 7/1986 | Nishitani et al. | 156/643 |
| 4,698,787 | 10/1987 | Mukherjee et al. | 365/185 |
| 4,698,900 | 10/1987 | Esquivel | 437/52 |
| 4,763,177 | 8/1988 | Paterson | 357/23.5 |

(List continued on next page.)

FOREIGN PATENT DOCUMENTS

| | | | |
|---|---|---|---|
| 56-96865 | 8/1981 | Japan | 257/330 |
| 57-85260 | 5/1982 | Japan | 257/327 |
| 60-136369 | 7/1985 | Japan | 257/329 |
| 63-244683 | 10/1988 | Japan | 257/331 |
| 5-13760 | 1/1993 | Japan | 257/327 |
| 5-315622 | 11/1993 | Japan | 257/330 |
| 6-61487 | 3/1994 | Japan | 257/327 |

OTHER PUBLICATIONS

Betty Prince, "Semiconductor Memories: A Handbook of Design, Manufacture, and Application", pp. 182–187, 586–608.

Seiichi Aritome et al., "Reliability Issues of Flash Memory Cells", Proceedings of the IEEE, vol. 81, No. 5, May 1993, pp. 776–788.

Shin–ichi Kobayashi et al., "Memory Array Architecture and Decoding Scheme for 3 V Only Sector Erasable DINOR Flash Memory", IEEE Journal of Solid–State Circuits, vol. 29, No. 4, Apr. 1994, pp. 454–460.

S. Wolf & R.N. Tauber, "Silicon Processing For the VLSI EVA", vol. I, pp. 384–385, 1986.

S. Wolf, "Silicon Processing For the VLSI EVA", vol. II, pp. 104–107, 32–43, 354–359.

*Primary Examiner*—Steven H. Loke
*Attorney, Agent, or Firm*—Skjerven,Morrill,MacPherson, Franklin and Friel; Edward C. Kwok

[57] ABSTRACT

A field effect transistor has a short gate and is fabricated by: doping the bottom surface of a depression to form a relatively lightly doped region in the bottom of the depression; forming the gate of the field effect transistor on the sidewall of the depression such that the gate is insulated from the sidewall by a thin insulating layer; and implanting dopants to form the drain region and the source region of the transistor using the gate to mask a part of the relatively lightly doped region. The part of the relatively lightly doped region which is masked by the gate during implanting of the source and drain regions constitutes a lightly doped drain region of the transistor. The drain of the transistor is formed into the bottom of the depression. The length of the gate is primarily determined by the depth and/or profile of the sidewall. The source-to-drain on-resistance of the transistor is low because the transistor does not have a lightly doped source region. The transistor has high quality gate oxide because the sidewall of the depression upon which the gate oxide is grown is substantially free of ion impact damage.

2 Claims, 6 Drawing Sheets

U.S. PATENT DOCUMENTS

| | | | |
|---|---|---|---|
| 4,780,424 | 10/1988 | Holler et al. | 437/29 |
| 4,814,286 | 3/1989 | Tam | 437/27 |
| 4,849,363 | 7/1989 | Coffey et al. | 437/19 |
| 4,890,144 | 12/1989 | Teng et al. | 365/182 |
| 4,929,988 | 5/1990 | Yoshikawa | 357/23.5 |
| 4,964,080 | 10/1990 | Tzeng | 365/185 |
| 5,017,977 | 5/1991 | Richardson | 357/23.5 |
| 5,047,812 | 9/1991 | Pfiester | 257/329 |
| 5,049,515 | 9/1991 | Tzeng | 437/43 |
| 5,053,842 | 10/1991 | Kojima | 357/23.5 |
| 5,073,513 | 12/1991 | Lee | 437/43 |
| 5,077,230 | 12/1991 | Woo et al. | 437/43 |
| 5,077,691 | 12/1991 | Haddad et al. | 365/218 |
| 5,087,584 | 2/1992 | Wada et al. | 437/43 |
| 5,102,814 | 4/1992 | Woo | 437/43 |
| 5,103,274 | 4/1992 | Tang et al. | 357/23.5 |
| 5,108,937 | 4/1992 | Tsai et al. | 437/40 GS |
| 5,111,270 | 5/1992 | Tzeng | 357/23.5 |
| 5,120,671 | 6/1992 | Tang et al. | 437/43 |
| 5,196,722 | 3/1993 | Bergendahl et al. | 257/304 |
| 5,235,544 | 8/1993 | Caywood | 365/185 |
| 5,245,570 | 9/1993 | Fazio et al. | 365/185 |
| 5,245,572 | 9/1993 | Kosonocky et al. | 365/189.02 |
| 5,268,319 | 12/1993 | Harari | 437/43 |
| 5,289,026 | 2/1994 | Ong | 257/316 |
| 5,293,328 | 3/1994 | Amin et al. | 365/185 |
| 5,297,082 | 3/1994 | Lee | 365/185 |
| 5,301,150 | 4/1994 | Sullivan et al. | 365/185 |
| 5,329,487 | 7/1994 | Gupta et al. | 365/185 |
| 5,338,953 | 8/1994 | Wake | 267/316 |
| 5,342,796 | 8/1994 | Ahn et al. | 437/41 RG |
| 5,343,063 | 8/1994 | Yuan et al. | 257/317 |
| 5,365,082 | 11/1994 | Gill et al. | 257/374 |
| 5,371,030 | 12/1994 | Bergemont | 437/52 |
| 5,378,909 | 1/1995 | Chang et al. | 257/316 |
| 5,379,255 | 1/1995 | Shah | 365/185 |
| 5,386,388 | 1/1995 | Atwood et al. | 365/201 |
| 5,390,146 | 2/1995 | Atwood et al. | 365/185 |
| 5,399,516 | 3/1995 | Bergendahl et al. | 437/43 |
| 5,399,917 | 3/1995 | Allen et al. | 327/436 |
| 5,402,370 | 3/1995 | Fazio et al. | 365/185 |
| 5,402,371 | 3/1995 | Ono | 365/185 |
| 5,402,374 | 3/1995 | Tsuruta et al. | 365/185 |
| 5,406,529 | 4/1995 | Asano | 365/230.03 |
| 5,408,115 | 4/1995 | Chang | 257/324 |
| 5,424,233 | 6/1995 | Yang et al. | 437/203 |
| 5,448,094 | 9/1995 | Hsu | 257/401 |
| 5,453,637 | 9/1995 | Fong-Chun et al. | 257/390 |
| 5,598,037 | 1/1997 | Kikuchi et al. | 257/329 |

FIRST S/D MASK

SECOND S/D MASK

THREE-DIMENSIONAL COMPLEMENTARY FIELD EFFECT TRANSISTOR PROCESS AND STRUCTURES

This application is a division of application Ser. No. 08/509,911, filed Aug. 1, 1995, now U.S. Pat. No. 5,672,524.

FIELD OF THE INVENTION

This invention relates to a field effect transistor having a gate formed on a sidewall of a semiconductor step.

BACKGROUND INFORMATION

First, in order to increase the density and performance of VLSI (very large scale integrated circuits) integrated circuits such as memory circuits, the transistors disposed on the integrated circuit are made smaller and smaller. To further decrease transistor geometries below about 0.25 microns (gate length), advanced lithography tools including advanced steppers will likely be required. These tools are still being developed and are very expensive. It therefore is desirable to make smaller geometry transistors without using these advanced lithography tools.

Figure 1:
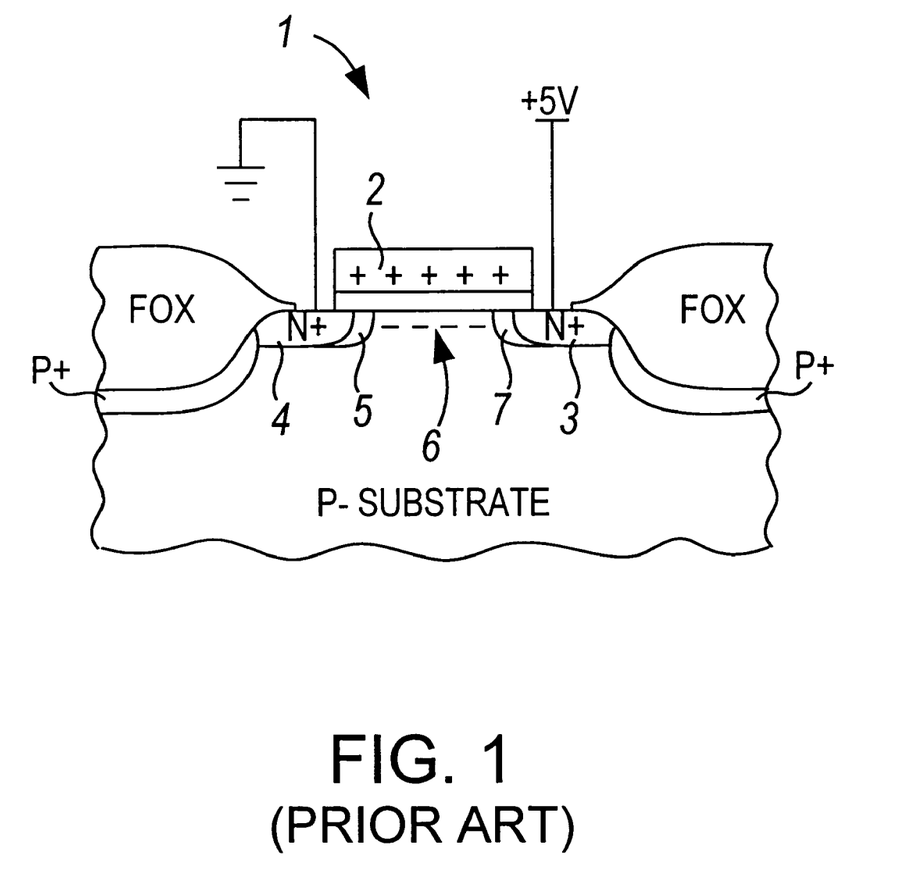
FIG. 1 (Prior Art) is a simplified cross-sectional diagram of an N-channel field effect transistor having a lightly doped drain region and a lightly doped source region.

Second, transistors may incorporate lightly doped drain regions in order to reduce hot carrier injection problems. FIG. 1 (Prior Art) is a simplified cross-sectional diagram of an N-channel transistor 1. To turn the transistor on, a positive voltage is applied to the gate 2. Electrons can then flow (due to the N+ type drain region 3 being positively biased with respect to the N+ type source region 4) from the N+ type source region 4, through the N– type lightly doped source region 5, through an inverted region 6 of silicon underneath the gate, through the N– type lightly doped drain region 7, and into the N+ type drain region 3. If lightly doped drain region 7 were not present, then the region between the drain region 3 and the region 6 would have a greater electric field (due to the bias voltage present between the drain and source regions). Accordingly, an electron traveling from region 6 and into drain region 3 would be accelerated by the electric field at the junction. This accelerated electron (called a "hot carrier") could then be injected into the gate oxide and become trapped in the gate oxide. This trapping of electrons degrades transistor performance.

In order to reduce the magnitude of the electric field, N– type lightly doped drain region 7 is provided so that the depletion region between regions 3 and 6 will be spread over a greater distance. It is generally true, however, that a double diffusion process is used to form lightly doped drain regions. As a result, an unwanted lightly doped source region is also formed when the desired lightly doped drain is being formed. Not only is the lightly doped source region not needed to reduce hot carrier injection effects, but the resistance added by the lightly doped source region increases the source-to-drain on-resistance of the transistor and therefore degrades transistor performance.

SUMMARY

A process for forming a field effect transistor is sought which allows: 1) a small gate length to be defined without using advanced lithography tools, 2) a lightly doped drain region to be formed without simultaneously forming a lightly doped source region. The invention is particularly applicable in digital logic applications and in semiconductor memories.

In accordance with one embodiment, a field effect transistor is fabricated by: doping the bottom of a depression to form a relatively lightly doped region in the bottom of the depression; forming the gate of the transistor on a sidewall of the depression such that the gate is insulated from the sidewall by a thin insulating layer; and implanting dopants to form the drain region and the source region of the transistor using the gate to mask a part of the relatively lightly doped region. The part of the relatively lightly doped region which is masked by the gate during implanting of the source and drain regions constitutes a lightly doped drain region of the transistor. Accordingly, the length of the gate is primarily determined by the depth and/or profile of the sidewall and no lightly doped source region is formed.

Because forming such a sidewall by plasma etching (for example, by reactive ion etching) may damage the semiconductor lattice at the bottom edge of the sidewall and on the sidewall itself, thermal oxides grown on such sidewalls may be of low quality. A transistor using such a low quality thermal oxide for its gate oxide may fail due to shorting through the oxide over time and/or may suffer from threshold changes and/or may have inferior performance.

Accordingly, a depression is formed into a semiconductor surface by growing a thick thermal oxide down into a semiconductor material, and then removing the thick thermal oxide to reveal the depression. The depression has a steep sidewall so that a gate can thereafter be formed on the steep sidewall (the gate being insulated from the sidewall by an insulator layer) in a manner similar to the manner in which spacers are formed. The depression also has a more gently sloping sidewall so that no gate material will remain on the gently sloping sidewall after the gate is formed. A relatively thin layer of nitride is used to form a relatively pointed bird's beak of the thick thermal oxide thereby forming the gently sloping sidewall. A relatively thick layer of nitride is used to form a relatively blunt bird's beak of the thick thermal oxide thereby forming the steep sidewall.

Numerous other structures and methods are also disclosed. This summary does not purport to define the invention. The invention is defined by the appended claims.

DETAILED DESCRIPTION OF THE PREFERRED EMBODIMENTS

FIGS. 2–20 illustrate a method of making a transistor. The subject matter of U.S. patent application Ser. No. 08/501,118, entitled "THREE-DIMENSIONAL NON-VOLATILE MEMORY", filed on the same day as the present disclosure, is expressly incorporated herein by reference.

First, N wells (not shown) for accommodating P-channel transistors are formed in a P– type semiconductor material 100. This P– type semiconductor material may, for example, be either substrate silicon or epitaxial silicon. In the illustrated embodiment, the P− type semiconductor material is substrate silicon having a doping concentration in the range of approximately 1E13 atoms/cm$^3$ to 1E16 atoms/cm$^3$.

Thereafter, a thin layer of oxide 101 is thermally grown on the upper surface of P− type semiconductor material 100. In the illustrated embodiment, thin oxide layer 101 has a thickness in the range of approximately 50–1000 angstroms and preferably has a thickness of approximately 500 angstroms.

A thin layer of nitride 102 is then deposited on thin oxide layer 101. In the illustrated embodiment, thin nitride layer 102 has a thickness in the range of approximately 50–1000 angstroms and preferably has a thickness of approximately 500 angstroms.

Figure 2:
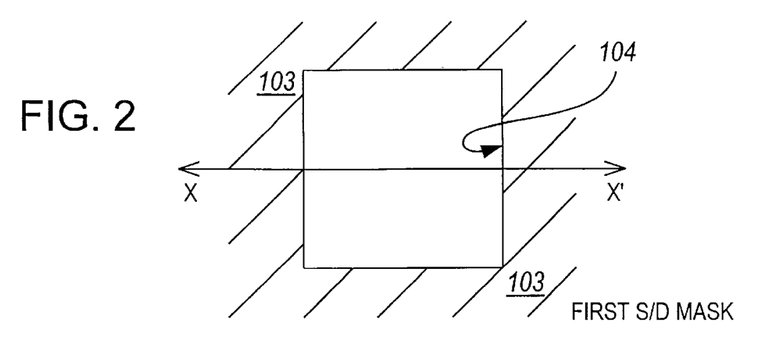
FIGS. 2–20 are simplified diagrams illustrating a method of making a transistor in accordance with the present invention.
Figure 3:
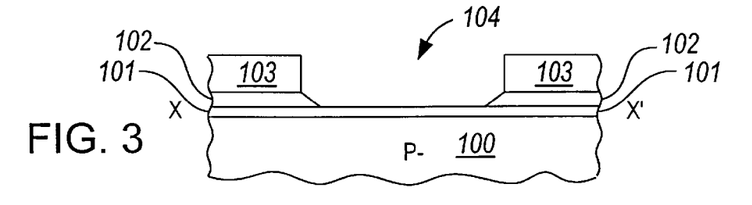

A first source/drain mask 104 of photoresist is then formed to have an opening 104. The portion of the nitride exposed by opening 103 is then removed. Plasma isotropic etching can be used to achieve a nitride edge profile of 30–60 degrees. FIG. 2 is a top-down diagram showing opening 104 in first source/drain mask 103. FIG. 3 is a simplified cross-sectional diagram showing the resulting structure taken along line XX' of FIG. 2.

Without removing thin nitride layer 102, the oxide exposed by opening 104 and the photoresist mask 103 is removed. A thin layer of oxide 105 is then formed over thin nitride layer 102 and on semiconductor material 100 where the semiconductor material is not covered by nitride layer 102. Any suitable oxidation step may be used including a TEOS step, an LTO (low temperature oxide) deposition step or an HTO (high temperature oxide) deposition step. Thin oxide layer 105 has a thickness in the range of approximately 50–500 angstroms and preferably has a thickness of approximately 250 angstroms.

A relatively thick nitride layer 106 is then deposited on thin oxide layer 105 over the entire structure. Relatively thick nitride layer 106 has a thickness in the range of approximately 1000–3000 angstroms and preferably has a thickness of approximately 2000 angstroms.

A second source/drain mask 107 of photoresist is then formed having an opening 108. The portion of the thick nitride layer 106 exposed by opening 108 is then removed by an anisotropic etch such as (RIE) reactive ion etching. The etching has high selectivity of nitride to oxide. Oxide layer 105 therefore prevents the etching of thin nitride layer 102.

Figure 4:
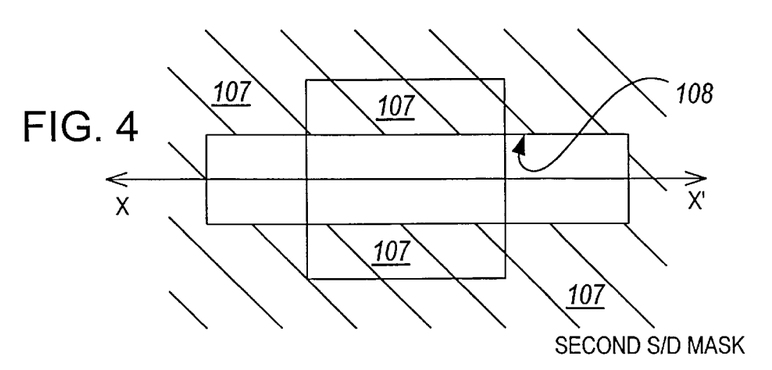
Figure 5:
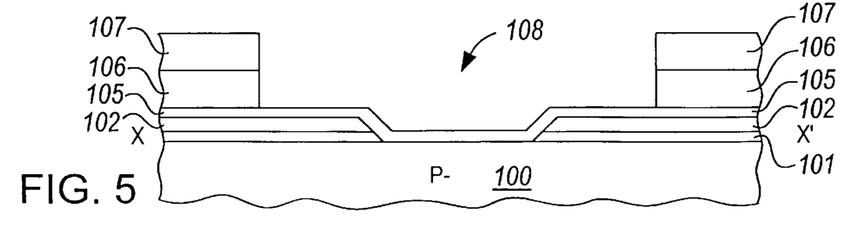

FIG. 4 is a top-down diagram showing opening 108 in second source/drain mask 107. Note that opening 108 in second source/drain mask 107 is longer and more narrow than is opening 104 in first source/drain mask 103. As shown in FIG. 5, portions of thin nitride layer 102 are left uncovered by thick nitride layer 106. Additionally, portions of thick nitride layer 106 remain which do not have any thin nitride underneath them.

Figure 6:
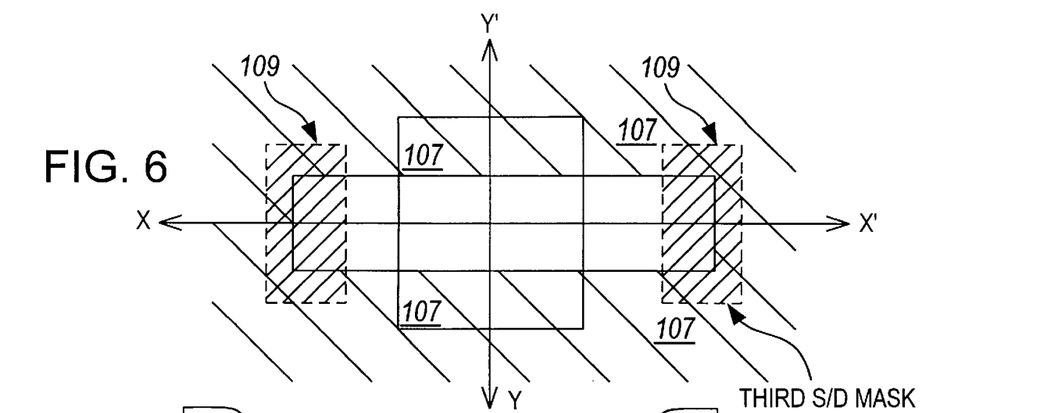
Figure 7:
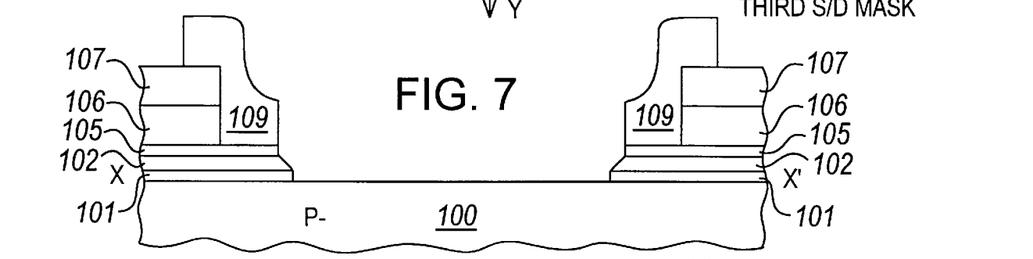
Figure 8:
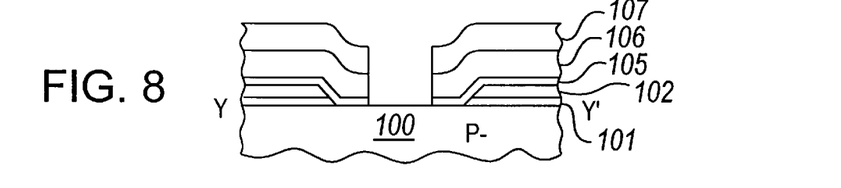

Without removing the second source/drain mask 107, additional photoresist is applied and formed into a third source/drain mask 109. The oxide and nitride not protected by the second and third source/drain masks is then removed by plasma etching. FIG. 6 is a top-down diagram showing two rectangular portions of third source/drain mask 109. FIG. 7 is a simplified cross-sectional diagram taken along line XX' of FIG. 6 whereas FIG. 8 is, a simplified cross-sectional diagram taken along line YY' of FIG. 6. The third source/drain mask may be negative type photoresist if the second source/drain mask is positive type photoresist, and visa versa. After etching, a photoresist strip step is performed to remove all portions of the second and third source/drain masks.

Figure 9:
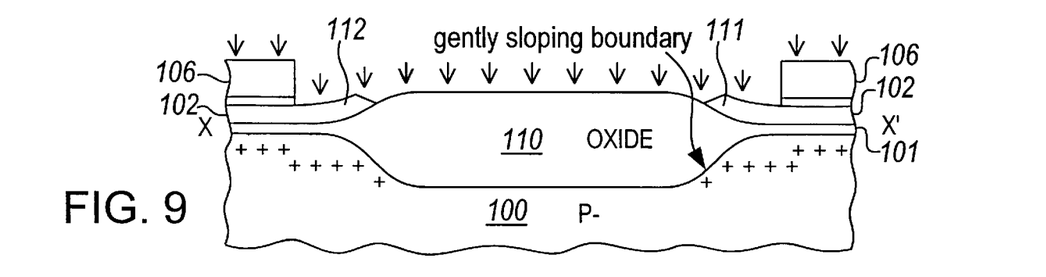
Figure 10:
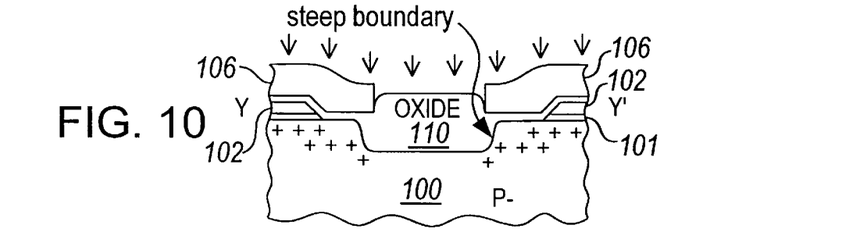

A thick thermal oxide layer 110 is then grown on the surfaces of semiconductor material 100 which are not protected from oxidation by nitride. In some embodiments, a high temperature dry thermal oxidation process is used as set forth in U.S. Pat. No. 5,151,381. The subject matter of U.S. Pat. No. 5,151,381 is incorporated herein by reference. Thick oxide layer 110 has a thickness in the range of approximately 1500–6000 angstroms and preferably has a thickness of approximately 3000 angstroms. Greater thicknesses generally correspond with greater gate lengths. FIG. 9 is a simplified cross-sectional diagram showing thick oxide layer 110 along the line XX' of FIG. 6. FIG. 10 is a simplified cross-sectional diagram showing thick oxide layer 110 along the line YY' of FIG. 6.

Note the different shapes of the bird's beaks of thick oxide layer 110 in FIGS. 9 and 10. The long and thin beams 111 and 112 of nitride layer 102 in FIG. 9 allow oxide 110 to lift and bend beams 111 and 112 so that a relatively gently sloping oxide 110 to semiconductor material 100 boundary is formed. Making the beams of thin nitride as opposed to a thicker material makes the beams easier to bend. Making the beams long as opposed to short gives the oxide 110 an additional mechanical advantage in bending the beams.

The relatively thick nitride layer 106, on the other hand, is more difficult to bend and lift. Consequently, the oxide 110 to semiconductor material 100 boundary in FIG. 10 is relatively steep as compared with the gently sloping boundary of FIG. 9.

A P type field and channel implant is then performed. P type dopants are implanted through both the thick nitride layer 106 and also through the thin nitride layer 102. The depth at which the dopants are implanted into semiconductor material 100 varies depending on how much overlying material the dopants must pass before reaching the underlying semiconductor material. The thick oxide 110 is adequately thick to prevent P type dopants from being implanted underneath the thickest portion of oxide 110. It is to be understood that the precise placement of the P type dopants will vary depending on specifics of the particular embodiment and that the placement of P type dopants shown in FIGS. 9 and 10 with plus signs is presented only for illustrative purposes. The actual placement of the P type dopants may be different. The P type dopant is boron implanted with a dose within the range of approximately 1E13 atoms/cm$^2$ to 5E14 atoms/cm$^2$ and with an implant energy within the range of approximately 50–300 KeV. In a preferred embodiment, the dose of boron is approximately 5E13 atoms/cm$^2$ and the implant energy is approximately 100 KeV.

Figure 11:
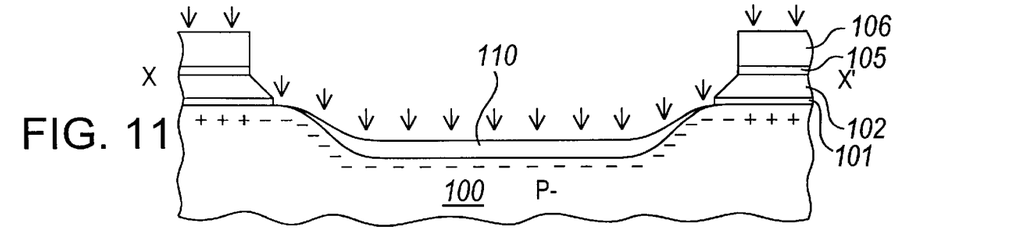
Figure 12:
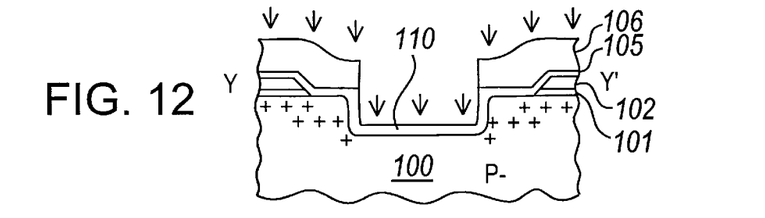

A thick oxide etch back step is then performed. In some embodiments, reactive ion etching is used to achieve anisotropic etching. A typical oxide/nitride selectivity of 3:1 is used meaning that oxide is etched three times faster than nitride. FIGS. 11 and 12 are simplified cross-sectional diagrams showing the results of the thick oxide etch back. During the oxide etch back, thick nitride layer 106 may be reduced in thickness to approximately 1000 angstroms. The thickness of oxide 110 in the bottom of the etched depression may be approximately 300 angstroms.

An N− type lightly doped drain implant is then performed as illustrated in FIGS. 11 and 12. The minus signs illustrate implanted N type dopants. Phosphorous may be implanted with a dose in the range of approximately 1E12 atoms/cm$^2$ to 1E14 atoms/cm$^2$ and with an implant energy in the range of approximately 20 KeV to 70 KeV. In a preferred embodiment, the dose of phosphorous is approximately 3E13 atoms/cm$^2$ with an implant energy of approximately 40 KeV.

A nitride etch is then performed to remove the approximately 1000 angstroms of thick nitride layer 106 remaining. In some embodiments, the nitride etch has a selectivity of 3:1 meaning that nitride is etched three times faster than oxide.

Figure 13:
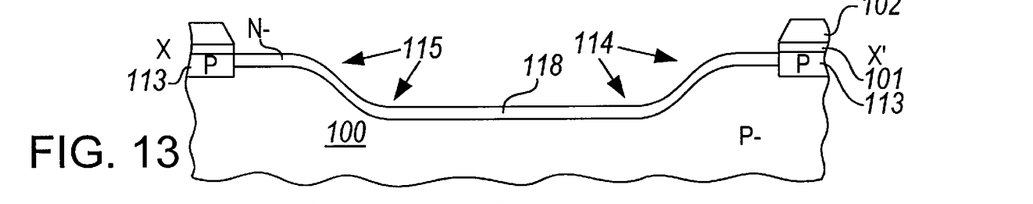
Figure 14:
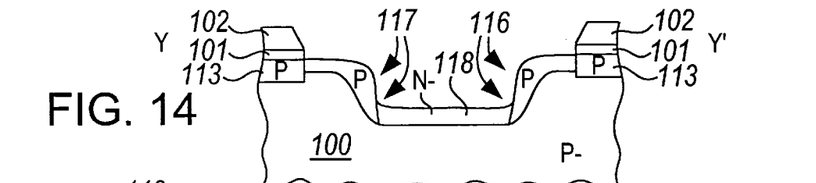

A wet oxide etch is then performed to remove all that remains of this oxide layer 105 and oxide 110. FIGS. 13 and 14 are cross-sectional diagrams of the resulting structure. The P type dopants which were implanted through both the thin and the thick nitride layers as illustrated in FIGS. 9 and 10 are illustrated in FIGS. 13 and 14 as a P type region 113. The exposed upper surface of semiconductor material 100 forms a depression having two gently sloping sidewall portions 114 and 115 as shown in cross-section in FIG. 13 and also having two steep sidewall portions 116 and 117 as shown in cross-section in FIG. 14. N type dopants from the previous N− type lightly doped drain implant step define a N− type lightly doped region 118 on the bottom surface of the depression.

A gate oxidation layer 119 is formed on the exposed surfaces of the semiconductor material 100 and the exposed surfaces of nitride layer 102. After the gate oxidation layer is formed, a polysilicon/polycide layer is deposited over the entire structure and is doped to be highly conductive. In one embodiment, an overlying layer of a refractory metal such as tungsten is formed on an underlying layer of polysilicon. Alternatively, only polysilicon is used rather than a polysilicon/polycide layer.

Figure 15:
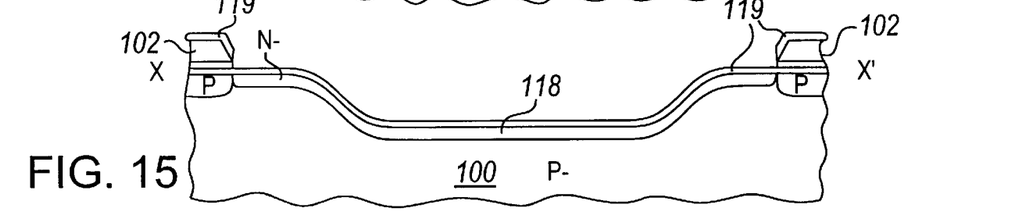
Figure 16:
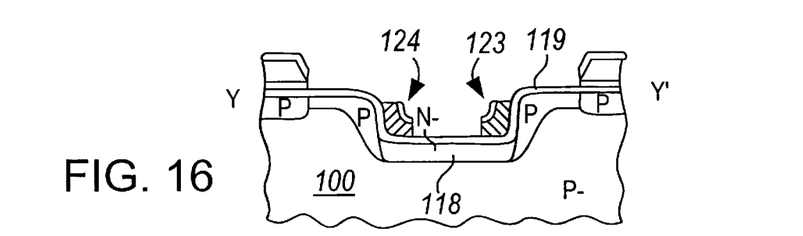
Figure 17:
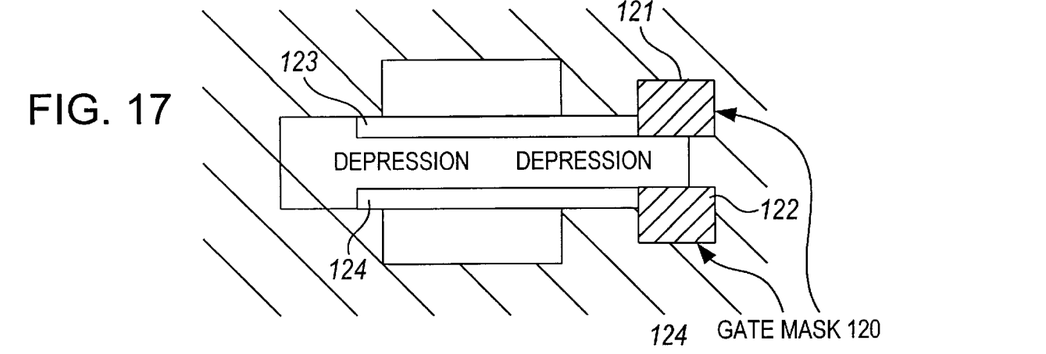

As shown in the top-down diagram of FIG. 17, a photoresist gate mask 120 is then formed to mask gate pad portions 121 and 122 of the polysilicon/polycide layer from subsequent removal during etching. A reactive ion etching step is then performed to form a polysilicon/polycide gate pad portion 121 which is integral with a polysilicon/polycide gate 123 and to form a polysilicon/polycide gate pad portion 122 which is integral with a polysilicon/polycide gate 124. Care is taken during this etching step that the polysilicon/polycide which is to make up gates 123 and 124 is not removed from the steep sidewalls 116 and 117 of the depression (gates 123 and 124 are insulated from the steep sidewalls of semiconductor material 100 by oxide 119) but that all the polysilicon/polycide is removed from the gently sloping sidewalls 114 and 115 of the depression. Suitable techniques for forming spacers in other semiconductor structures can be employed here. Conductive materials other than polysilicon/polycide can be used to form the gate. FIGS. 15 and 16 are simplified cross-sectional diagrams illustrating the resulting gates 123 and 124. In some embodiments, another layer of oxide and/or additional nitride can be deposited over nitride 102 so that nitride 102 will not be removed during the polysilicon/polycide gate etching step.

Figure 18:
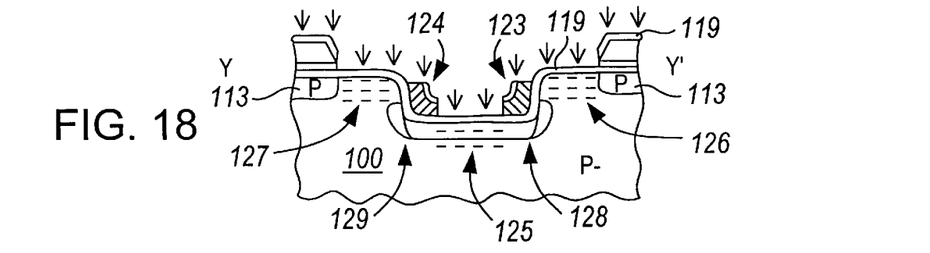

FIG. 18 illustrates that (after the gate mask is removed) a heavy N+ type source/drain implant step is performed to form N+ type drain region 125 and N+ type source regions 126 and 127. The portions 128 and 129 of the lightly doped region 118 are, however, masked by gates 123 and 124 and are not implanted. The result of this masking is two narrow strip-like N− type lightly doped drain regions 128 and 129 formed along the bottom corners of the depression where the steep sidewalls meet the bottom of the depression and an N+ type drain region 125 formed on the bottom the depression in between the two lightly doped drain regions. In some embodiments, the drain and source regions are implanted with arsenic with a dose in the range of approximately 1E15 atoms/cm$^2$ to 1E16 atoms/cm$^2$ and an implant energy in the range of approximately 20 KeV to 100 KeV. In a preferred embodiment, arsenic is implanted with a dose of approximately 5E15 atoms/cm$^2$ and an implant energy of approximately 60 KeV.

Oxide spacers 130 and 131 are then formed over gates 123 and 124, respectively, using a conventional oxide spacer forming technique. Oxide may, for example, be deposited over the entire device surface using LTO deposition. Reactive ion etching may then be used to remove oxide layer by oxide layer until oxide remains in corner regions but oxide does not cover large flat surfaces areas.

Conductive salicide regions 132–134 (such as titanium-silicide regions) are then formed on the upper surfaces of the source and drain regions. After the salicide regions are formed, the dopants in the source and drain regions are activated in an anneal step. This anneal step may be a rapid thermal anneal (RTA) for a relatively short time or alternatively may be a longer anneal in a furnace.

Figure 19:
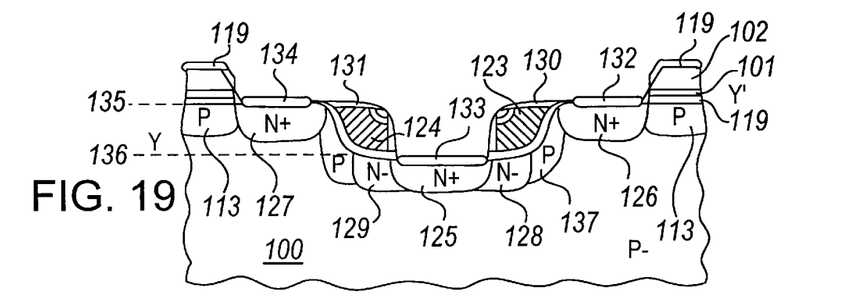

FIG. 19 is a simplified cross-sectional diagram taken in the YY' dimension illustrating the resulting structure. Two transistors are actually formed which share a common drain in the bottom of the depression, drain region 125. The source regions 126 and 127 extend into semiconductor material 100 from substantially planar portions of the upper surface of material 100 disposed in or very close to plane 135. The drain region 125, on the other hand, extends into semiconductor material 100 from a substantially planar portion of the upper surface which is disposed on the bottom of the depression in or very close to plane 136. (The surface of the semiconductor material 100 prior to the formation of the silicide regions is used here for planes 135 and 136 although the silicide actually reacts down into the source and drain regions a small distance.) As illustrated, planes 135 and 136 are displaced from one another in the vertical dimension. Placing a positive bias on gate 123, for example, turns the transistor having gate 123 on by causing a surface portion of P type channel region 137 to invert. If the drain region 125 is positively biased with respect to the source region 126, electrons flow in a conductive path from N+ type source region 126, through the inverted portion of P type channel region 137, through N− type lightly doped drain region 128 and into N+ type drain region 125.

The lack of an N− type lightly doped source region facilitates a lower source-to-drain on-resistance than would otherwise be achieved. Moreover, the gate can be made shorter because the lack of the lightly doped source results in a greater effective channel length for the same gate length. The gate being disposed on the sidewall (with an intervening gate oxide) allows the transistor to occupy less lateral area on a semiconductor die.

Figure 20:
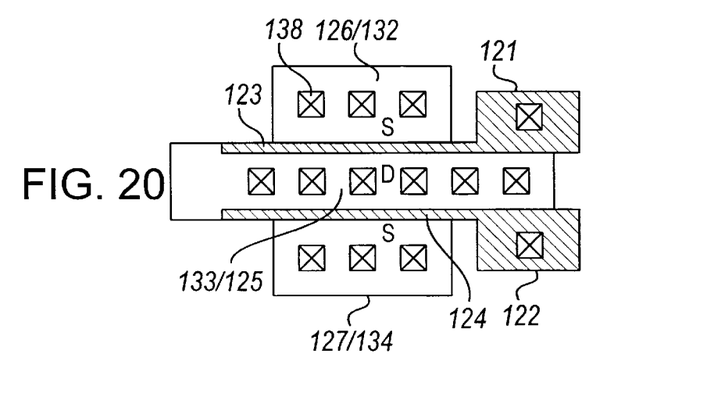

After the formation of the salicide regions 132–134, metal contacts 138 and overlying metal interconnect (not shown) are formed to establish contact with the salicide regions 132–134 of the transistor structure. FIG. 20 is a simplified top-down diagram illustrating the placement of metal contacts 138 as well as the outline of the drain region 125, the source region 132 and the source region 134. After the metal interconnect is formed, a passivation layer may be formed over the entire integrated circuit.

In some embodiments, selective thick oxide areas on the integrated circuit may be protected prior to the thick oxide etch back step (see FIGS. 11 and 12) so that the thick oxide will remain under speed critical signal lines thereby providing low capacitance between the speed critical signal lines and the underlying semiconductor material. If transistors having short gate lengths are desired on the same integrated circuit as other transistors having longer gate lengths, then the gates of the short gate length transistors can be formed on depression sidewalls using the above described three-dimensional process whereas the longer gates of the other transistors can be fabricated at the same time using a conventional CMOS process which shares processing steps with the three-dimensional process.

Figure 21:
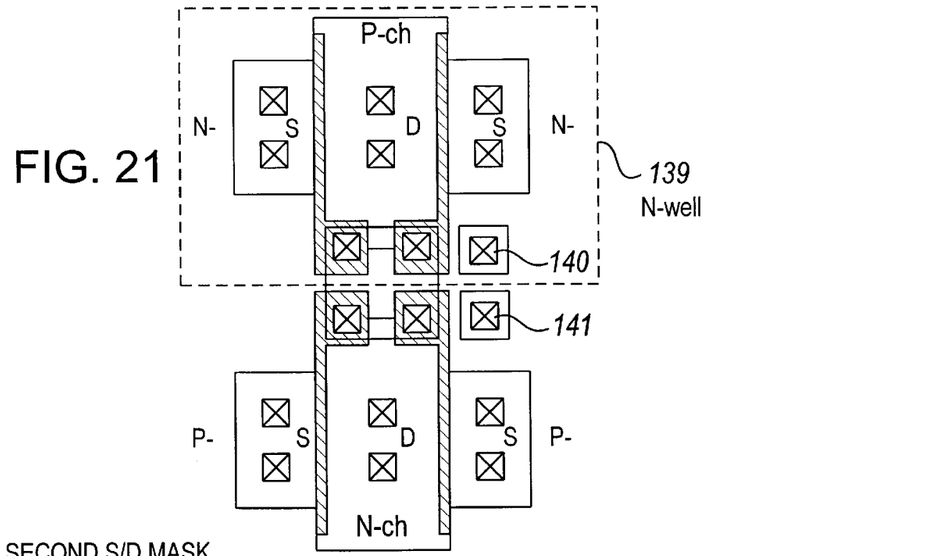
FIG. 21 is a simplified top-down diagram illustrating an inverter structure in accordance with the present invention.

FIG. 21 is a top-down diagram illustrating a digital logic inverter structure. Two P-channel transistors which share a common drain are disposed in an N-well 139. A contact 140 is provided to the N-well as is a contact to the P– type semiconductor material in which the N-channel source and are formed. The source and drain regions are connected together by metal (not shown). It is understood that other digital logic gates and structures can be formed using the invention. The two depressions of FIG. 21 may, for example, be merged so that all four transistors are formed on sidewalls of the same depression.

Figure 22:
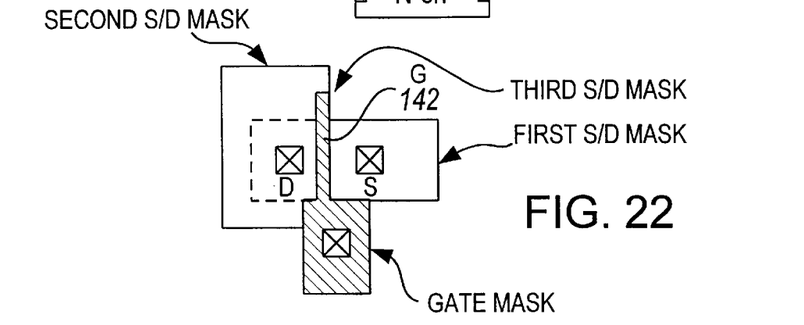
FIG. 22 is a simplified top-down diagram illustrating a single transistor structure in accordance with the present invention.

FIG. 22 is a top-down diagram illustrating a single transistor structure wherein the gate 142 is formed on a steep sidewall of a depression (or step). The first, second and third source/drain masks correspond with the first, second and third source/drain masks in the above-described process.

Figure 23:
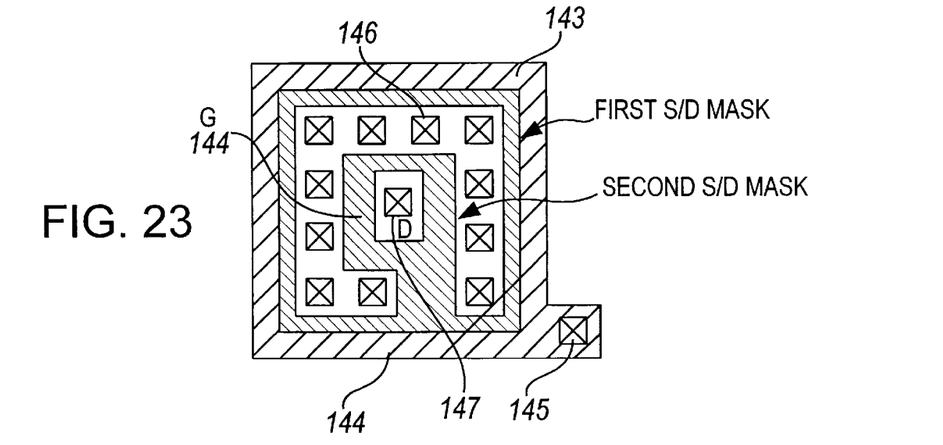
FIG. 23 is a top-down diagram illustrating a "donut" transistor structure in accordance with the present invention.

FIG. 23 is a top-down diagram illustrating a transistor structure (called a "donut" transistor). A narrow strip-like portion 143 (called a "gate ring") of the polysilicon/polycide material of which the gate 144 is formed surrounds the source region and the gate 144. A gate contact 145 is provided as are source contacts 146 and a drain contact 147. The drain region is disposed in a rectangular depression in the semiconductor material corresponding with the depression discussed above in connection with the structure of FIG. 20.

Although the present invention is described in connection with certain specific embodiments for instructional purposes, the present invention is not limited thereto. The terms vertical and lateral are relative to one another and are otherwise not limiting. When it is stated that the gate is disposed "on" the sidewall, it is understood that there is intervening thin insulting layer between the gate and the semiconductor material of the sidewall. Techniques of forming a depression or step other than using thin and thick nitride layers to control bird's beak profile may be employed. Channel region 137 may not be doped in some embodiments. Both P-channel and N-channel devices can be realized. Accordingly, various modifications, adaptations, and combinations of various structures and steps of the described embodiments can be practiced without departing from the scope of the invention as set forth in the following claims.

What is claimed is:

1. An inverter, comprising:
   a semiconductor material having a depression; and
   two P-channel transistors and two N-channel transistors, the gates of all the four transistors being formed on sidewalls of the depression, and the gates of all the four transistors being electrically coupled together.

2. An inverter, comprising:
   a first P-channel transistor having a gate disposed on a first sidewall of a first depression;
   a second P-channel transistor having a gate disposed on a second sidewall of the first depression, the first and second sidewalls of the first depression being opposing and parallel to one another;
   a first N-channel transistor having a gate disposed on a first sidewall of a second depression;
   a second N-channel transistor having a gate disposed on a second sidewall of the second depression, the first and second sidewalls of the second depression being opposing and parallel to one another, the gates of the first and second P-channel transistors being coupled to the gates of the first and second N-channel transistors.

* * * * *

UNITED STATES PATENT AND TRADEMARK OFFICE
CERTIFICATE OF CORRECTION

PATENT NO. : 5,925,909
DATED : July 20, 1999
INVENTOR(S) : Liu, Yowjuang W.; Sun, Yu It is certified that error appears in the above-identified patent and that said Letters Patent is hereby corrected as shown below:

Column 3,
Line 15, delete "104" and insert -- 103 --
Line 17, delete "103" and insert -- 104 --

Signed and Sealed this

Twenty-sixth Day of March, 2002

Attest:

JAMES E. ROGAN
Attesting Officer
Director of the United States Patent and Trademark Office